United States Patent [19]

Shinozaki

[11] Patent Number: 5,063,310

[45] Date of Patent: Nov. 5, 1991

[54] TRANSISTOR WRITE CURRENT SWITCHING CIRCUIT FOR MAGNETIC RECORDING

[75] Inventor: Eiji Shinozaki, Tokyo, Japan

[73] Assignee: NEC Corporation, Tokyo, Japan

[21] Appl. No.: 614,510

[22] Filed: Nov. 16, 1990

[30] Foreign Application Priority Data

Nov. 17, 1989 [JP] Japan .................................. 1-299341

[51] Int. Cl.[5] ............................................. H03F 3/04
[52] U.S. Cl. ..................................... 307/570; 307/446;
307/270; 307/493; 323/315
[58] Field of Search ............... 307/570, 446, 270, 493;
323/315, 316, 317

[56]  References Cited
U.S. PATENT DOCUMENTS

| 4,603,291 | 7/1986 | Nelson | 323/315 |
| 4,678,942 | 7/1987 | Kanai et al. | 307/270 |
| 4,721,866 | 1/1988 | Cli et al. | 307/270 |
| 4,897,564 | 1/1990 | Clen | 307/570 |
| 4,910,480 | 3/1990 | Crosby | 323/315 |
| 4,943,743 | 7/1990 | Pelley, III et al. | 307/446 |
| 4,958,094 | 9/1990 | Ishii et al. | 307/570 |

Primary Examiner—Stanley D. Miller
Assistant Examiner—Scott A. Ouellette
Attorney, Agent, or Firm—Whitham & Marhoefer

[57] ABSTRACT

A transistor circuit of the invention comprises a current mirror circuit including input-side bipolar transistors and output-side bipolar transistors, an on-off control circuit including MOS transistors for on-off controlling of the base current of the output-side bipolar transistors, and MOS transistors for rendering the output-side bipolar transistors to securely turn off. The MOS transistors are normally connected between the bases of the output-side transistors and a ground terminal.

17 Claims, 2 Drawing Sheets

TRANSISTOR WRITE CURRENT SWITCHING CIRCUIT FOR MAGNETIC RECORDING

BACKGROUND OF THE INVENTION

The present invention relates to a transistor circuit, and more particularly, to a transistor circuit for switching a write current for magnetic recording.

In a conventional transistor circuit for switching a write current for magnetic recording, there is known a circuit configuration shown in FIG. 3. In FIG. 3, the conventional circuit includes a current mirror circuit portion and a current switching circuit portion.

The current mirror circuit portion includes an NPN transistor $Q_{31}$ having its collector connected to an input terminal $IN_{31}$ and its emitter connected to a resistor $R_{31}$ connected to the ground GND, and another NPN transistor $Q_{32}$ the base of which is connected to the collector of the NPN transistor $Q_{31}$. The base of the NPN transistor $Q_{31}$, the emitter of the NPN transistor $Q_{32}$ and the base of an NPN transistor $Q_{33}$ are connected together and are connected through a resistor $R_{32}$, to a ground terminal GND. The collector of the NPN transistor $Q_{32}$ is connected to a power supply terminal Vcc. The emitter of the NPN transistor $Q_{33}$ is connected to the ground terminal GND through a resistor $R_{33}$, and the collector of the transistor $Q_{33}$ constitutes an output terminal of the current mirror circuit portion.

The current switching circuit portion includes a pair of NPN transistors $Q_{34}$ and $Q_{35}$, the emitters of which are commonly connected to the output terminal of the abovementioned current mirror circuit portion, which is formed by the collector of the NPN transistor $Q_{33}$. The base and the collector of the NPN transistor $Q_{34}$ are connected to a control terminal $C_{31}$ and an output terminal $O_{31}$, respectively. The base and the collector of the NPN transistor $Q_{35}$ are connected to another control terminal $C_{32}$ and another output terminal $O_{32}$, respectively. Thus, all the transistors in the circuit of FIG. 3 are of an NPN conductivity type, for the purpose of illustration. However, all of those transistors may be of a PNP conductivity type in operation.

The operation of the conventional circuit will now be described.

When an input current $I_{\beta 1}$ is applied from the input terminal $IN_{31}$, the current mirror circuit portion inverts the input current to produce an output current $I_{O3}$. The output current $I_{O3}$ is drawn in or fed into the collector of the transistor $Q_{33}$. The magnitude of the output current $I_{O3}$ is determined by the emitter size ratio of the transistors $Q_{31}$ and $Q_{33}$ and/or the resistance ratio of the resistors $R_{32}$ and $R_{33}$.

The current inverted by the current mirror circuit portion is outputted at the output terminal $O_{31}$ or $O_{32}$ or is switched therebetween by the current switching circuit portion. When the potential at the control terminal $C_{31}$ is higher by above 100 mV than the potential at the control terminal $C_{32}$, a current is drawn in from the output terminal $O_{31}$ as an output current $I_{O31}$. On the other hand, when the potential at the control terminal $C_{32}$ is higher by above 100 mV than the potential at the control terminal $C_{31}$, a current is drawn in from the output terminal $O_{32}$ as an output current $I_{O32}$. Further, when the potential difference between the control terminal $C_{31}$, $C_{32}$ and the ground terminal GND is smaller than 0.7 V, a current is not drawn into the transistor $Q_{33}$ from either of the output terminals $O_{31}$ and $O_{32}$.

The conventional magnetic recording write current switching circuit as mentioned above has the following three problems:

Firstly, bipolar transistors having a finite current amplification factor $h_{FE}$ are used for current switching. The $h_{FE}$ values of transistors formed in an integrated circuit (IC) are uneven, and as a result, an error in the base current component is caused, thereby making it difficult to provide output currents with high accuracy. The accuracy of write current for magnetic recording is usually in the order of $\pm 5\%$. For example, assume that the current amplification factor $h_{FE}$ has a fluctuation of 50 to 200 in manufacture, the output current $I_{O31}$ or $I_{O32}$ fluctuates between 98.0% and 99.5% of the output current $I_{O3}$. Therefore, the output current results in an unevenness or fluctuation of 1.5% in its value due to the unevenness of the current amplification factor $h_{FE}$.

Secondly, when the potential difference between the control terminal $C_{31}$ and the ground terminal GND and the potential difference between the control terminal $C_{32}$ and CND both are set to be smaller than 0.7 V in order to prevent a current from being drawn in from the output terminals $O_{31}$ and/or $O_{32}$, the bipolar transistor $Q_{33}$ causes a saturation, so that if the current switching circuit is formed in a monolithic integrated circuit, a large amount of current passes through a substrate in which the monolithic integrated circuit is formed due to an action of a parasitic transistor of the transistor $Q_{33}$, to a disadvantage.

Thirdly, the potential at the output terminals $O_{31}$, $O_{32}$ must be kept at a high value in order to improve the accuracy of the output current. However, when the potential at the output terminal $O_{31}$ or $O_{32}$ falls due to a flyback voltage generated at the switching of a magnetic recording write current, or when the potential at the output terminal $O_{31}$ or $O_{32}$ is low, the output current $I_{O31}$ or $I_{O32}$ is not drawn into the transistor $Q_{33}$. As a result, the transition time for current switching becomes elongated, to disadvantage. More specifically, when the potential at the control terminal $C_{31}$ is higher than the potential at the control terminal $C_{32}$, the potential at the output terminal $O_{31}$ must be kept at a voltage (in the order of 0.5 V) higher than the emitter potential of the transistor $Q_{34}$ and higher than the saturation voltage of the transistor $Q_{33}$. In other words, the potential at the output terminal $O_{31}$ must be kept at a voltage larger than the potential at the control terminal $C_{31}$ minus 0.2 V. The minimum potential at the control terminal $C_{31}$ is determined to be 1.5 volts since the voltage drop across the resistor $R_{33}$ is about 0.3 V, the saturation voltage of the transistor $Q_{33}$ is about 0.5 V and the base-emitter voltage of the transistor $Q_{35}$ is about 0.7 V. Accordingly, the minimum potential at the output terminal $O_{31}$ has to be 1.3 V. Thus, the conventional current switching bipolar transistor circuit does not operate at a lower potential at which the output terminal is kept.

SUMMARY OF THE INVENTION

It is, therefore, one object of the present invention to provide a transistor circuit which provides a high-accuracy output current and operates at a low output potential.

Another object of the present invention is to provide a write current switching circuit for magnetic recording in which a high accuracy write current is produced with a low saturation voltage.

A further object of the present invention is to provide a write current switching circuit suitable for fabricating in a bipolar-MOS transistor integrated circuit form.

According to one feature of the present invention, a write current switching circuit for magnetic recording comprises a current mirror circuit including input-side bipolar transistor and output-side bipolar transistors, an on-off control circuit including MOS transistors for on-off controlling of the base current of the output-side bipolar transistors, and MOS transistor means for rendering the output-side bipolar transistors to securely turn off. The MOS transistor means are normally connected between the bases of the output-side transistors and a ground terminal.

In accordance with an aspect of the present invention, there is provided a transistor circuit comprising a current mirror circuit including an input terminal, a ground terminal, an input-side bipolar transistor and output-side bipolar transistors, a first MOS transistor for supplying a base current to the input bipolar transistor and second and third MOS transistors for supplying base currents to the output-side bipolar transistors, fourth and fifth MOS transistors connected between the ground terminal and bases of the output-side bipolar transistors, respectively, the input-side bipolar transistor and the output-side bipolar transistors being supplied with respective base currents from a potential point connected to the input terminal through a base-emitter path of another bipolar transistor, through the first, second and third MOS transistors, the first MOS transistor being constantly in its on state, the second and fourth MOS transistors connected to one of the output-side bipolar transistors being alternately on-off switched, and the third and fifth MOS transistors connected to the other of the output-side bipolar transistors being alternately on-off switched.

BRIEF DESCRIPTION OF THE DRAWINGS

The above and other objects, features and advantages of the present invention will be apparent from the following description of preferred embodiments of the invention explained with reference to the accompanying drawings, in which.

Throughout the following description, like reference numerals and symbols indicate like components and parts.

THE DETAILED DESCRIPTION OF THE EMBODIMENTS

The embodiments of the invention will be in detail described with reference to the accompanying drawings.

Figure 1:
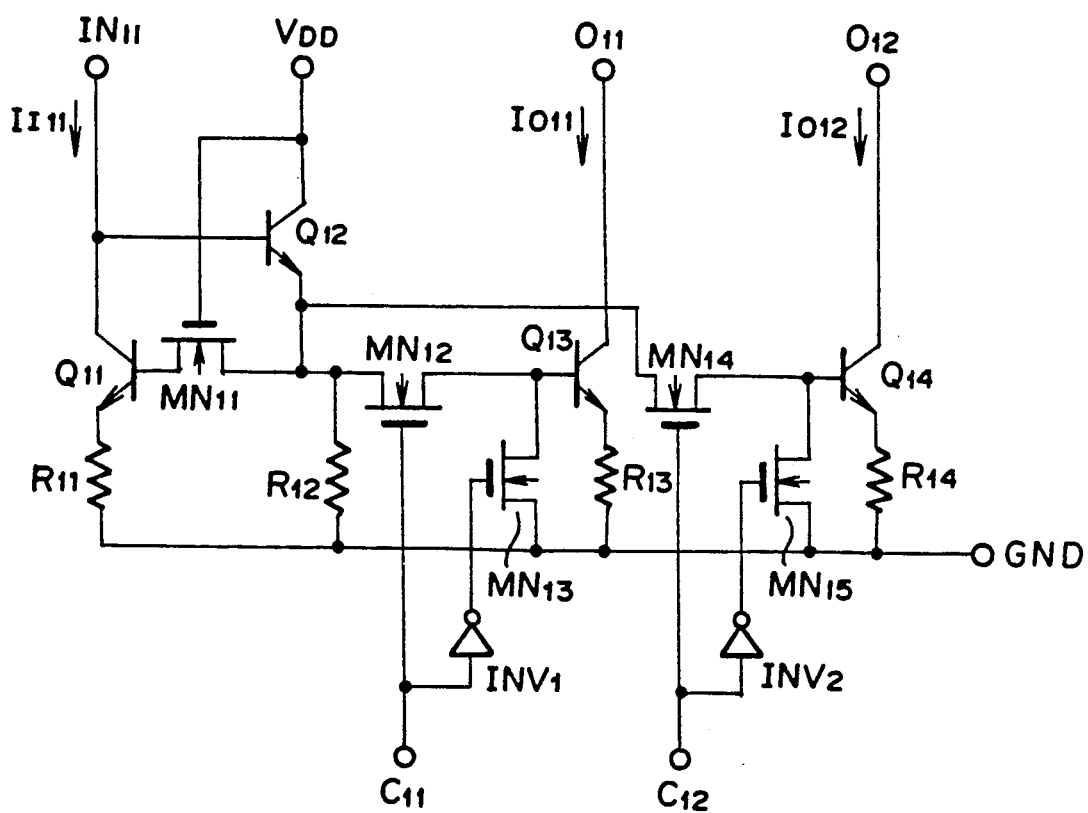
FIG. 1 is a circuit diagram showing a transistor circuit according to one embodiment of the present invention.

FIG. 1 shows, in a circuit diagram, one embodiment of the present invention.

In FIG. 1, NPN transistors $Q_{11}$, $Q_{13}$ and $Q_{14}$ are connected to a ground terminal GND through resistors $R_{11}$, $R_{13}$ and $R_{14}$, respectively. The bases of the NPN transistors $Q_{11}$, $Q_{13}$ and $Q_{14}$ are connected to the emitter of an NPN transistor $Q_{12}$ through the source-drain paths of N-channel MOS transistors $MN_{11}$, $MN_{12}$ and $MN_{14}$, respectively. The bases of the NPN transistors $Q_{13}$ and $Q_{14}$ are connected to the ground terminal GND through the source-drain paths of N-channel MOS transistors $MN_{13}$ and $MN_{15}$, respectively. The collectors of the NPN transistors $Q_{13}$ and $Q_{14}$ are connected to output terminals $O_{11}$ and $O_{12}$, respectively. The base of the NPN transistor $Q_{12}$ is connected to an input terminal $IN_{11}$ together with the collector of the NPN transistor $Q_{11}$. The collector of the NPN transistor $Q_{12}$ and the gate of the MOS transistor $MN_{11}$ are connected in common to a power supply terminal $V_{DD}$. A resistor $R_{12}$ is connected between the emitter of the NPN transistor $Q_{12}$ and the ground terminal GND. The gates of the N-channel MOS transistors $MN_{12}$ and $MN_{14}$ are connected to control terminals $C_{11}$ and $C_{12}$, respectively. The gates of the MOS transistors $MN_{13}$ and $MN_{15}$ are connected to the control terminals $C_{11}$ and $C_{12}$ through invertors $INV_1$ and $INV_2$, respectively. The back gates of all the MOS transistors mentioned above are connected to the ground terminal GND.

The operation of the above-mentioned circuit will now be described.

The N-channel MOS transistor $MN_{11}$ is always turned on because of its gate being connected to the power supply terminal $V_{DD}$.

Accordingly, when an input current $I_{I11}$ is applied to the input terminal $IN_{11}$, the NPN transistor $Q_{12}$ is turned on and then the NPN transistor $Q_{11}$ is supplied with a base current through the emitter of transistor $Q_{12}$ and the source-drain path of the MOS transistor $MN_{11}$, so that the NPN transistor $Q_{11}$ draws the input current in from its collector connected to the input terminal $I_{I11}$ and, thus the input-side operation of the current mirror circuit starts. Here, assume that the potential of the control terminal $C_{11}$ is the same as that of the power supply terminal $V_{DD}$ and the potential of the control terminal $C_{12}$ is the same as that of the ground terminal GND, the MOS transistors $MN_{12}$ and $MN_{15}$ are turned on while the MOS transistors $MN_{13}$ and $MN_{14}$ are turned off. As a result, a base current is applied to the NPN transistor $Q_{13}$ and the transistor $Q_{13}$ operates to draw thereinto an output current $I_{O11}$ from the output terminal $O_{11}$.

Since the MOS transistor $MN_{14}$ is turned off and the MOS transistor $MN_{15}$ is turned on, the base potential of the NPN transistor $Q_{14}$ is substantially the same as the potential of the ground terminal GND. As a result, the NPN transistor $Q_{14}$ is in its off state, and the output current $I_{O12}$ is not drawn in from the output terminal $O_{12}$. On the other hand, when the potential at the control terminal $C_{11}$ is the same as the potential of the ground terminal GND and the potential at the control terminal $C_{12}$ is the same as the potential of the power supply terminal $V_{DD}$, the output current $I_{O12}$ is drawn in from the output terminal $O_{12}$ and the output current $I_{O11}$ is not drawn in from the output terminal $O_{11}$. Also, when the control terminals $C_{11}$ and $C_{12}$ both are at the same potential as that of the ground terminal GND, the output currents $I_{O11}$ and $I_{O12}$ are not drawn in from the output terminals $O_{11}$ and $O_{12}$, respectively.

Further, when both the potentials at the control terminals $C_{11}$, $C_{12}$ are the same as the potential of the power supply terminal $V_{DD}$, the transistors $MN_{12}$, $MN_{14}$ are turned on while the transistors $MN_{13}$, $MN_{15}$ are turned off. As a result, the output currents $I_{O11}$, $I_{O12}$ are drawn in from the output terminals $O_{11}$, $O_{12}$.

As explained above, with the combination of the voltage levels or potentials at the control terminals $C_{11}$, $C_{12}$, the currents being supplied to the load circuits (not shown) respectively connected to the output terminals $O_{11}$, $O_{12}$ can be controlled.

Further, in the case where the output terminals $O_{11}$, $O_{12}$ of the transistor circuit are connected together so as to form a common output terminal, the value of current obtained at this common output terminal can be varied or controlled in accordance with the combination of the voltage levels or potentials at the control terminals $C_{11}$, $C_{12}$.

In the transistor circuit according to this embodiment, bipolar transistors are not used for current switching, so that an error due to the uneven base current component of the bipolar transistor is not caused. Even when the output currents are not drawn in from both the output terminals $O_{11}$ and $O_{12}$, the MOS transistors $MN_{12}$ and $MN_{14}$ inhibit base currents to be applied to the NPN transistors $Q_{13}$ and $Q_{14}$, whereby a current due to the saturation of the transistors $Q_{13}$ and $Q_{14}$ is prevented from flowing into the circuit substrate. The conventional circuit needs a potential of about 1.3 V at the output terminal in order to accurately draw the output current in. In contrast, in this embodiment, the potential at the output terminal may be held at more than the sum of a voltage drop (about 0.3 V) across the resistor $R_{13}$ or resistor $R_{14}$ and a saturation voltage (about 0.5 V) of the NPN transistor $Q_{13}$ or $Q_{14}$, resulting in a reduced transition time in the current switching.

In the embodiment of the present invention, the MOS transistor $MN_{11}$ is provided in order to further improve the accuracy of the write current. Assuming that the input current $I_{I11}$ to output current $I_{O11}$ ratio is 1:N, the transistor $Q_{11}$ to transistor $Q_{13}$ emitter size ratio is 1:N, and the resistor $R_{11}$ to resistor $R_{13}$ resistance ratio is N:1. The transistor $Q_{11}$ to transistor $Q_{13}$ base current ratio becomes 1:N. Assuming now that the ratio between $W_{11}/L_{11}$ and $W_{12}/L_{12}$ is N:1 where $L_{11}$ and $L_{12}$ are the gate lengths of the MOS transistors $MN_{11}$ and $MN_{12}$, respectively, and $W_{11}$ and $W_{12}$ are the gate widths of the MOS transistors $MN_{11}$ and $MN_{12}$, respectively, the on-resistance ratio between the MOS transistors $MN_{11}$ and $MN_{12}$ becomes N:1. Since the base current ratio between the transistors $Q_{11}$ and $Q_{13}$ is 1:N and the on-resistance ratio between the MOS transistors $MN_{11}$ and $MN_{12}$ is N:1, the voltage drop across the source and the drain of the MOS transistor $MN_{11}$ becomes equal to the voltage drop across the source and the drain of the MOS transistor $MN_{12}$. Accordingly, the base potential of the NPN transistor $Q_{11}$ is equal to the base potential of the NPN transistor $Q_{13}$, and the ratio between the input current $I_{I11}$ and the output current $I_{O11}$ becomes 1:N.

Figure 2:
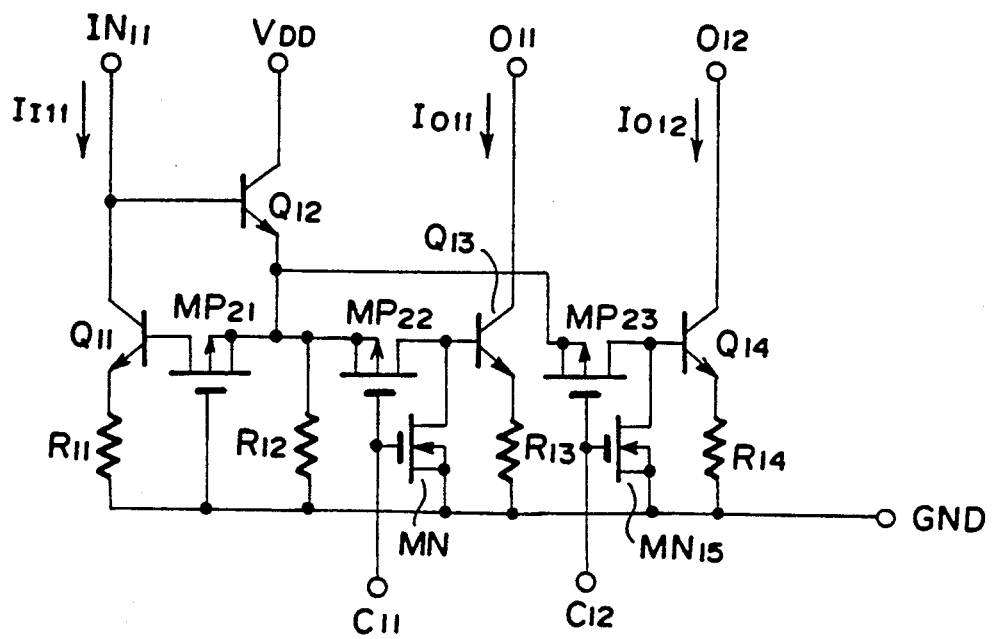
FIG. 2 is a circuit diagram showing a transistor circuit according to another embodiment of the present invention.
Figure 3:
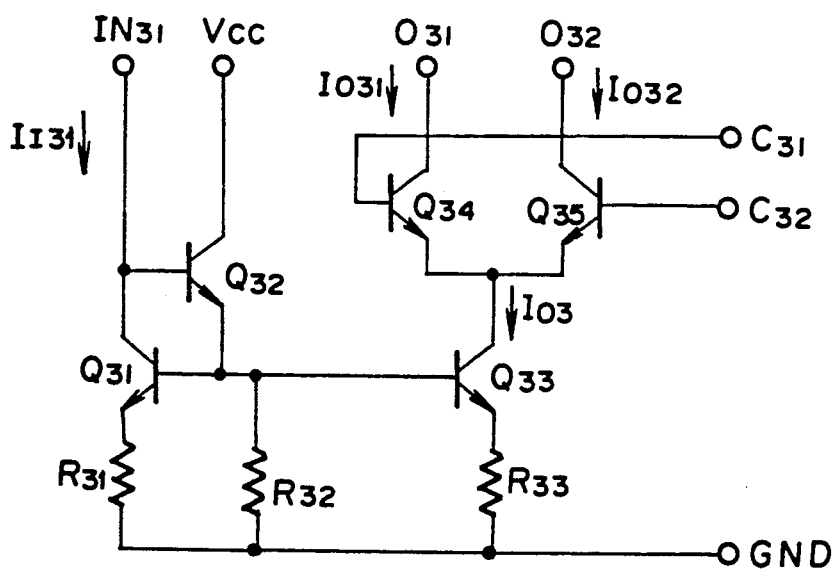
FIG. 3 is a circuit diagram showing a conventional magnetic recording write current switching circuit.

FIG. 2 shows a transistor circuit according to another embodiment of the present invention.

This embodiment is distinguished from the preceding embodiment in that the N-channel MOS transistors $MN_{11}$, $MN_{12}$ and $MN_{14}$ used for on-off switching of the base current of the bipolar transistors are substituted by P-channel MOS transistors $MP_{21}$, $MP_{22}$ and $MP_{23}$, respectively. Other remaining elements in this embodiment are the same as those shown in FIG. 1. The same elements are shown by the same reference numerals and explanations therefor are omitted here.

The embodiment with reference to FIG. 2 is the same the embodiment of FIG. 1 in operational principle, but it is advantageous in that the MOS transistor for on-off switching of the base current of the transistor $Q_{13}$ or $Q_{14}$ and the MOS transistor for on-off switching of the base-ground terminal path of the transistor $Q_{13}$ or $Q_{14}$ are complementary or in a CMOS circuit form, whereby the invertors $INV_1$ and $INV_2$ connected to the control terminals $C_{11}$ and $C_{12}$ in the embodiment of FIG. 1 can be dispensed with.

In the embodiment of FIG. 2, the threshold voltage ($V_T$) of each of the P-channel MOS transistors must be lower than the emitter potential of the transistor $Q_{12}$ in operation.

In the above respective embodiments, the transistor $Q_{12}$ may be omitted and in this case the input terminal $IN_{11}$ may be connected directly to a circuit node or a junction between the transistors $MN_{11}$ and $MN_{12}$ (or the transistors $MP_{21}$ and $MP_{22}$), and the resistor $R_{12}$ may be omitted. The NPN transistors $Q_{11}$ through $Q_{14}$ may be substituted by N-channel MOSFETs, respectively. Specifically, there may be provided a transistor which has a first and a second main electrode and a control electrode and with which the impedance of a current path between the first and the second main electrode may be controlled in response to the control signal (voltage or current) applied to the control electrode. The first main electrode, the second main electrode and the control electrode may be of a collector (drain), an emitter (source) and a base (gate), respectively, and may be connected in the manner as shown in FIGS. 1 and 2.

As are apparent from the foregoing description, the present invention provides a transistor circuit comprising a current mirror circuit having bipolar transistors and MOS transistors for on-off switching of the base currents to an output-side transistor circuit in the current mirror circuit to thereby turn the output current of the current mirror circuit on and off. According to this configuration, a highly-accurate write current is produced with a lower potential at the output terminal, and no current leakage to the circuit substrate is caused when passing of the output current is cut off.

While the invention has been described in its preferred embodiments, it is to be understood that the words which have been used are words of description rather than limitation and that changes within the purview of the appended claims may be made without departing from the true scope and spirit of the invention in its broader aspects.

What is claimed is:

1. A transistor circuit comprising a current mirror circuit including an input current terminal, a first, second, third and fourth bipolar transistors, and first and second output current terminals; said first bipolar transistor being connected to said input current terminal and a source potential to produce a base current for each of said second, third and fourth bipolar transistors, said second bipolar transistor constituting an input-side transistor connected to said input current terminal, and said third and said fourth bipolar transistor constituting output-side transistors connected to said output current terminals, respectively, and said second, third and fourth bipolar transistors being coupled to a reference potential and supplied with said base current; and an output-side transistor on-off control circuit including first and second MOS transistors connected to the bases of said third and said fourth bipolar transistor for on-off switching of the base currents thereto in response to control signals applied to said first and second MOS transistors through first and second control terminals, respectively.

2. A transistor circuit according to claim 1, further comprising a third MOS transistor connected between the emitter of said first bipolar transistor and the base of said second bipolar transistor and having its gate connected to a constant operating potential.

3. A transistor circuit according to claim 1, further comprising an output-side transistor off state ensuring circuit including fourth and fifth MOS transistors connected to said third and said fourth bipolar transistor, respectively, for biasing said output-side bipolar transistors in their off state alternately.

4. A transistor circuit according to claim 3, wherein said output-side transistor on-off control circuit and said output-side transistor off state ensuring circuit are connected to said first and second control terminals so as to be supplied with on-off signals to said first and second MOS transistors, respectively.

5. A transistor circuit according to claim 4, wherein said first MOS transistor and said fourth MOS transistor are coupled to said first control terminal at their gates and said second MOS transistor and said fifth MOS transistor are coupled to said second control terminal at their gates, respectively.

6. A transistor circuit according to claim 5, wherein said first, second, fourth and fifth MOS transistors are of the same conductivity channel type, and first and second invertors are connected between the gate of said fourth MOS transistor and said first control terminal and between the gate of said fifth MOS transistor and said second control terminal, respectively, and the gate of said third MOS transistor is connected to a power supply terminal.

7. A transistor circuit according to claim 5, wherein said first and second MOS transistors are of a first conductivity channel type and said fourth and fifth MOS transistors are of a second conductivity channel type, and the gates of said fourth MOS transistor and said fifth MOS transistor are connected directly to said first and second control terminal, respectively, and the gate of said third MOS transistor is connected to a ground terminal.

8. A transistor circuit according to claim 2, wherein said first, second, third and fourth bipolar transistors are of an NPN type, the collectors of said first and second bipolar transistors are connected to a power supply terminal and said input current terminal, respectively, the emitters thereof are connected to a ground terminal through first and second resistors, respectively, the collectors of said third and fourth bipolar transistors are connected to said first and second output current terminals, respectively, and the emitters thereof are connected to said ground terminal through third and fourth resistors, respectively, and the bases of said first and second MOS transistors are connected to first and second control terminals coupled to be supplied with on-off control signals, respectively.

9. A transistor circuit according to claim 8, further comprising short-circuiting means connected between the base and the emitter of each of said third and fourth bipolar transistors, for short-circuiting said base and the ground terminal in response to the on-off control signal applied to said short-circuiting means to ensure the off state of the corresponding one of said third and fourth bipolar transistors.

10. A transistor circuit according to claim 2, wherein the ratio between the gate width to gate length value of said third MOS transistor and the gate width to gate length value of said first MOS transistor or said second MOS transistor is equal to an input current to output current ratio.

11. A transistor circuit comprising a current mirror circuit including an input terminal and output terminals, a ground terminal, an input-side bipolar transistor connected to said input terminal and output-side bipolar transistors connected to said output terminals, a first MOS transistor for supplying a base current to said input-side bipolar transistor and second and third MOS transistors for supplying base currents to said output-side bipolar transistors, fourth and fifth MOS transistors connected between said ground terminal and bases of said output-side bipolar transistors, respectively, a base current generating bipolar transistor having a base connected to said input terminal and a collector connected to a source potential, said input-side bipolar transistor and said output-side bipolar transistors being supplied with respective base currents from a potential point coupled to the emitter of said base current generating bipolar transistor, through said first, second and third MOS transistors, said first MOS transistor being constantly in its on state, said second and fourth MOS transistors being alternately on-off switched, and said third and fifth MOS transistors connected to the other of said output-side bipolar transistors being alternately on-off switched.

12. A transistor circuit having an input terminal, a first and a second output terminal, a reference potential terminal, a circuit node and a first and a second control terminal, said circuit comprising:
a first, a second and a third transistor each including a first and a second main electrode and a control electrode, the impedance of a current path between said first and said second main electrode being controlled responsive to a control signal applied to said control electrode;
a means for having the current path between said first and said second main electrode of said first transistor connected between said input terminal and said reference potential terminal;
a means for having said input terminal connected to said circuit node;
a means for having said circuit node connected to said control electrode of said first transistor;
a means for having the current path between said first and said second main electrode of said second transistor coupled between said first output terminal and said reference potential terminal;
a means for having the current path between said first and said second main electrode of said third transistor coupled between said second output terminal and said reference potential terminal;
a first switching means connected between said circuit node and said control electrode of said second transistor and to be ON or OFF state in response to the voltage level at said first control terminal; and
a second switching means connected between said circuit node and said control electrode of said third transistor and to be ON or OFF state in response to the voltage level at said second control terminal.

13. A transistor circuit according to claim 12, wherein said first, second and third transistors are bipolar transistors, said first and said second main electrode and said control electrode are of a collector, an emitter and a base, respectively, and said first and said second switching means are of an insulated-gate type field effect transistor, respectively.

14. A transistor circuit according to claim 13, further comprising a source potential terminal and wherein said means for connecting said input terminal to said circuit node includes a fourth bipolar transistor, said fourth transistor having a base and an emitter connected to said input terminal and said circuit node, respectively, and a collector connected to said source potential terminal, and said means for connecting said circuit node to said control electrode of said first transistor being of an insulated-gate type field effect transistor.

15. A transistor circuit having a current input terminal, a first and a second current output terminal, a circuit node, a reference potential terminal and a first and a second control terminal, said circuit comprising:
 a first transistor having a collector-emitter current path and being coupled between said current input terminal and said reference potential terminal;
 a first means for having said current input terminal connected to said circuit node;
 a second means for having said circuit node connected to a base of said first transistor;
 a second transistor having a collector-emitter current path and being coupled between said first current output terminal and said reference potential terminal;
 a third transistor having a collector-emitter current path and being connected between said second current output terminal and said reference potential terminal;
 a first switching means connected between said circuit node and a base of said second transistor and to be controlled in response to a voltage level applied to said first control terminal; and
 a second switching means connected between said circuit node and a base of said third transistor and to be controlled in response to a voltage level applied to said second control terminal.

16. A transistor circuit according to claim 15, wherein each of said first and said second switching means includes an insulated-gate type field effect transistor, said transistor having a source-drain path connected between said node and a base of the transistor corresponding thereto and having a gate connected to the control terminal corresponding thereto.

17. A transistor circuit according to claim 15, further comprising a source potential terminal and wherein said means for connecting said input terminal to said circuit node includes a fourth transistor of a bipolar type, said fourth transistor having a base and an emitter connected to said input terminal and said circuit node, respectively, and a collector connected to said source potential terminal, and said means for connecting said circuit node to said base of said first transistor being of an insulated-gate field effect transistor.

* * * * *